(12) United States Patent
Jeng et al.

(10) Patent No.: US 12,550,757 B2
(45) Date of Patent: Feb. 10, 2026

(54) CHIP PACKAGE STRUCTURE

(71) Applicant: Taiwan Semiconductor Manufacturing Company, Ltd., Hsinchu (TW)

(72) Inventors: Shin-Puu Jeng, Hsinchu (TW); Shuo-Mao Chen, New Taipei (TW); Feng-Cheng Hsu, New Taipei (TW); Po-Yao Lin, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/358,714

(22) Filed: Jul. 25, 2023

(65) Prior Publication Data
US 2023/0378076 A1 Nov. 23, 2023

Related U.S. Application Data

(60) Continuation of application No. 17/121,051, filed on Dec. 14, 2020, now Pat. No. 11,756,892, which is a
(Continued)

(51) Int. Cl.
| | |
|---|---|
| *H01L 23/538* | (2006.01) |
| *H01L 21/48* | (2006.01) |
| *H01L 21/56* | (2006.01) |
| *H01L 21/78* | (2006.01) |
| *H01L 23/00* | (2006.01) |
| *H01L 23/31* | (2006.01) |
| *H01L 25/16* | (2023.01) |

(52) U.S. Cl.
CPC ...... *H01L 23/5385* (2013.01); *H01L 21/4853* (2013.01); *H01L 21/4857* (2013.01);
(Continued)

(58) Field of Classification Search
CPC ....... H01L 23/5385; H01L 2224/13023; H01L 23/5389; H01L 2224/0104; H01L 24/05; H01L 24/13; H01L 24/14; H01L 24/16; H01L 2223/13076; H01L 2224/16227; H01L 2224/05027; H01L 2224/05016; H01L 2224/05572; H01L 2224/05562; H01L 2224/05024; H01L 23/3135; H01L 23/5383; H01L 23/16; H01L 23/18
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

*Primary Examiner* — Alia Sabur
(74) *Attorney, Agent, or Firm* — Birch, Stewart, Kolasch & Birch, LLP

(57) ABSTRACT

A chip package structure is provided. The chip package structure includes a first redistribution structure having a first surface and a second surface. The first redistribution structure includes a first pad and a second pad, the first pad is adjacent to the first surface, and the second pad is adjacent to and exposed from the second surface. The chip package structure includes a chip package bonded to the first pad through a first bump, wherein a first width of the first pad decreases in a first direction away from the chip package, and a second width of the second pad decreases in the first direction. The chip package structure includes a second bump over the second pad.

20 Claims, 13 Drawing Sheets

Related U.S. Application Data division of application No. 16/406,874, filed on May 8, 2019, now Pat. No. 10,867,925.

(60) Provisional application No. 62/700,396, filed on Jul. 19, 2018.

(52) U.S. Cl.
CPC .......... *H01L 21/561* (2013.01); *H01L 21/568* (2013.01); *H01L 21/78* (2013.01); *H01L 23/3128* (2013.01); *H01L 23/5383* (2013.01); *H01L 23/562* (2013.01); *H01L 24/16* (2013.01); *H01L 24/81* (2013.01); *H01L 25/162* (2013.01); *H01L 24/13* (2013.01); *H01L 2224/13111* (2013.01); *H01L 2224/13139* (2013.01); *H01L 2224/13144* (2013.01); *H01L 2224/16227* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,840,192 B1* | 11/2020 | Zohni | H01L 21/4817 |
| 2010/0109142 A1 | 5/2010 | Toh et al. | |
| 2012/0018871 A1* | 1/2012 | Lee | H01L 23/562 257/E23.194 |
| 2013/0161833 A1* | 6/2013 | Pendse | H01L 23/5389 257/777 |
| 2014/0054767 A1* | 2/2014 | Yoshida | H01L 24/03 257/737 |
| 2014/0353838 A1* | 12/2014 | Lin | H01L 23/055 257/773 |
| 2015/0255361 A1 | 9/2015 | Lee et al. | |
| 2015/0318262 A1 | 11/2015 | Gu et al. | |
| 2016/0338202 A1* | 11/2016 | Park | H01L 24/00 |
| 2018/0047651 A1* | 2/2018 | Chen | H01L 21/6835 |
| 2018/0175003 A1* | 6/2018 | Hu | H01L 25/0657 |
| 2018/0269181 A1* | 9/2018 | Yang | H01L 25/0655 |
| 2019/0043819 A1* | 2/2019 | Ho | H01L 23/3135 |
| 2019/0198478 A1 | 6/2019 | Keser et al. | |
| 2019/0244907 A1* | 8/2019 | Liao | H01L 23/5389 |
| 2019/0244946 A1* | 8/2019 | Kim | H01L 23/552 |
| 2020/0035606 A1 | 1/2020 | Bhagavat et al. | |
| 2020/0185314 A1* | 6/2020 | Kim | H01L 23/49822 |

* cited by examiner

CHIP PACKAGE STRUCTURE

PRIORITY CLAIM AND CROSS-REFERENCE

The present application is a Continuation of application Ser. No. 17/121,051, filed on Dec. 14, 2020, which is a Divisional of application Ser. No. 16/406,874, now U.S. Pat. No. 10,867,925, filed on May 8, 2019, which claims the benefit of U.S. Provisional Application No. 62/700,396, filed on Jul. 19, 2018, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits are typically manufactured on a semiconductor wafer. The semiconductor wafer may be singulated into dies. The dies may be packaged, and various technologies have been developed for packaging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
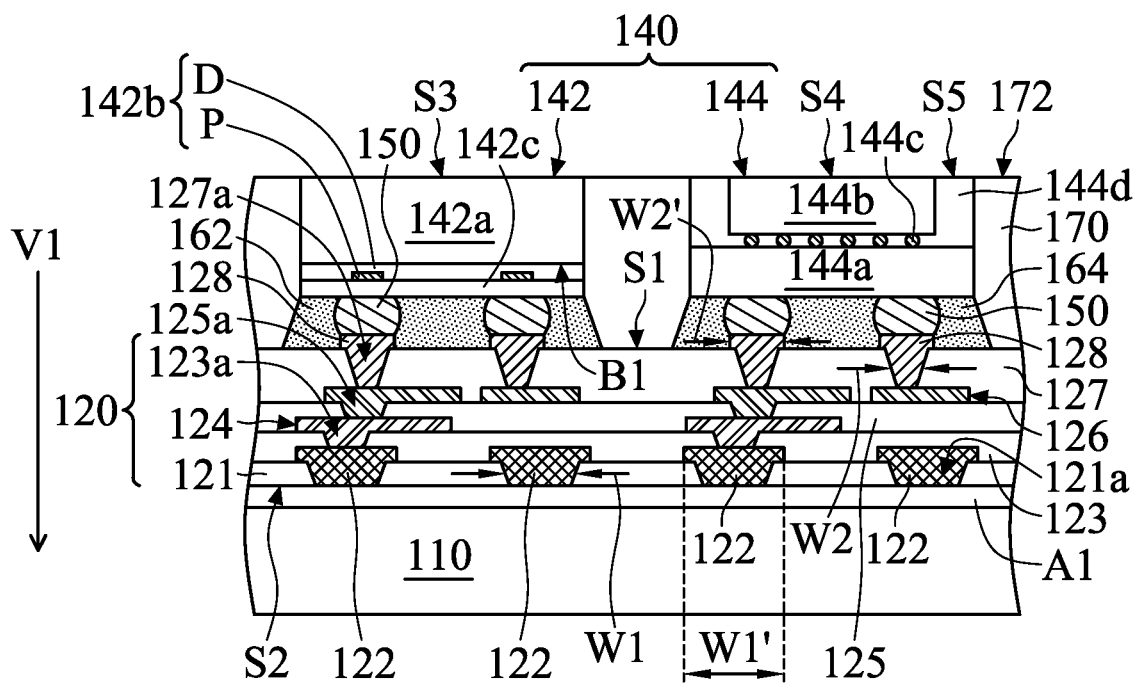
FIGS. 1A-1G are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1G are cross-sectional views of various stages of a process for forming a chip package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon, silicon oxide, aluminum oxide, metal, a combination thereof, and/or the like, in accordance with some embodiments. The carrier substrate 110 includes a metal frame, in accordance with some embodiments.

As shown in FIG. 1A, an adhesive layer A1 is formed over the carrier substrate 110, in accordance with some embodiments. The adhesive layer A1 is in direct contact with the carrier substrate 110, in accordance with some embodiments. The adhesive layer A1 is conformally formed on the carrier substrate 110, in accordance with some embodiments. The adhesive layer A1 is made of an insulating material, such as a polymer material, in accordance with some embodiments. The adhesive layer A1 is formed using a coating process or another suitable process.

As shown in FIG. 1A, a redistribution structure 120 is formed over the adhesive layer A1, in accordance with some embodiments. The redistribution structure 120 has surfaces S1 and S2, in accordance with some embodiments. The surface S1 is opposite to the surface S2, in accordance with some embodiments. The surface S2 faces the carrier substrate 110, in accordance with some embodiments.

The formation of the redistribution structure 120 includes forming a dielectric layer 121 over the adhesive layer A1; forming conductive pads 122 over the dielectric layer 121 and in through holes 121a of the dielectric layer 121; forming a dielectric layer 123 over the dielectric layer 121 and the conductive pads 122; forming a wiring layer 124 over the dielectric layer 123 and in through holes 123a of the dielectric layer 123; forming a dielectric layer 125 over the dielectric layer 123 and the wiring layer 124; forming a wiring layer 126 over the dielectric layer 125 and in through holes 125a of the dielectric layer 125; forming a dielectric layer 127 over the dielectric layer 125 and the wiring layer 126; and forming conductive pads 128 over the dielectric layer 127 and in through holes 127a of the dielectric layer 127.

The dielectric layer 121 is in direct contact with the adhesive layer A1, in accordance with some embodiments. The dielectric layer 121 is conformally formed on the adhesive layer A1, in accordance with some embodiments. In some embodiments, a width W1 of the conductive pad 122 in the dielectric layer 121 decreases along a direction V1 from the surface S1 to the surface S2.

In some embodiments, a width W2 of the conductive pad 128 in the dielectric layer 127 decreases along the direction V1. The conductive pad 122 is wider than the conductive pad 128, in accordance with some embodiments. For example, a maximum width W1' of the conductive pad 122 is greater than a maximum width W2' of the conductive pad 128. The wiring layers 124 and 126 are electrically connected to each other, in accordance with some embodiments. The conductive pads 122 and 128 are electrically connected to the wiring layers 124 and 126, in accordance with some embodiments.

The dielectric layers 121, 123, 125, and 127 are made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. Each of the dielectric layers 121, 123, 125, and 127 is formed using a deposition process (e.g. a chemical vapor deposition process or a physical vapor deposition process), a photolithography process, and an etching process, in accordance with some embodiments. The wiring layers 124 and 126 and the conductive pads 122 and 128 are made of a conductive material, such as metal (e.g. copper, aluminum, or tungsten), in accordance with some embodiments.

As shown in FIG. 1A, chip structures 140 are bonded to the redistribution structure 120 through conductive bumps 150, in accordance with some embodiments. The chip structures 140 include chips 142 and/or chip packages 144, in accordance with some embodiments. For the sake of simplicity, FIGS. 1A-1B and 1D-1G only show one of the chips 142 and one of the chip packages 144.

The chips 142 include a system-on-chip (SoC), a memory chip (e.g., a dynamic random access memory chip), or another suitable chip. The chips 142 and the chip packages 144 may have the same or different widths. The chips 142 and the chip packages 144 may have the same or different heights. The chip 142 has a substrate 142a, a device layer 142b, and an interconnect layer 142c, in accordance with some embodiments.

In some embodiments, the substrate 142a is made of an elementary semiconductor material including silicon or germanium in a single crystal, polycrystal, or amorphous structure. In some other embodiments, the substrate 142a is made of a compound semiconductor, such as silicon carbide, gallium arsenide, gallium phosphide, indium phosphide, indium arsenide, an alloy semiconductor, such as SiGe, or GaAsP, or a combination thereof.

The substrate 142a may also include multi-layer semiconductors, semiconductor on insulator (SOI) (such as silicon on insulator or germanium on insulator), or a combination thereof. The substrate 142a has a bottom surface B1 facing the redistribution structure 120, in accordance with some embodiments. The device layer 142b is over the bottom surface B1, in accordance with some embodiments. The device layer 142b includes electronic elements (not shown), a dielectric layer D, and conductive pads P, in accordance with some embodiments.

In some embodiments, electronic elements are formed on or in the substrate 142a. The electronic elements include active elements (e.g. transistors, diodes, or the like) and/or passive elements (e.g. resistors, capacitors, inductors, or the like), in accordance with some embodiments. The dielectric layer D is formed over the bottom surface B1 and covers the electronic elements, in accordance with some embodiments.

The conductive pads P are embedded in the dielectric layer D and are electrically connected to the electronic elements, in accordance with some embodiments. The conductive pads P are made of a conductive material, such as metal (e.g., copper, aluminum, nickel, or combinations thereof), in accordance with some embodiments.

The interconnect layer 142c is formed over the device layer 142b, in accordance with some embodiments. The interconnect layer 142c includes an interconnect structure (not shown) and a dielectric layer (not shown), in accordance with some embodiments. The interconnect structure is in the dielectric layer and electrically connected to the conductive pads P, in accordance with some embodiments.

In some embodiments, each of the chip packages 144 includes a redistribution structure (or a substrate) 144a, a chip 144b, conductive bumps 144c, and a molding layer 144d, in accordance with some embodiments. The redistribution structure 144a includes a dielectric layer (not shown) and wiring layers (not shown), in accordance with some embodiments. The wiring layers are in the dielectric layer, in accordance with some embodiments.

The chip 144b is bonded to the redistribution structure 144a through the conductive bumps 144c, in accordance with some embodiments. The chip 144b includes a dynamic random access memory (DRAM) chip, a high bandwidth memory (HBM) chip, or another suitable chip. The conductive bumps 144c electrically connect the chip 144b to the wiring layers of the redistribution structure 144a, in accordance with some embodiments.

The conductive bumps 144c are made of a solder material, such as Sn and Ag or another suitable conductive material (e.g., gold), in accordance with some embodiments. The molding layer 144d is formed over the redistribution structure 144a to surround the chip 144b and the conductive bumps 144c, in accordance with some embodiments. The molding layer 144d is made of a polymer material or another suitable insulating material.

Some of the conductive bumps 150 are between the conductive pads 128 and the interconnect layer 142c to electrically connect the conductive pads 128 to the conductive pads P through the interconnect structure of the interconnect layer 142c, in accordance with some embodiments. Some other conductive bumps 150 are between the conductive pads 128 and the redistribution structure 144a to electrically connect the conductive pads 128 to the chip 144b through the wiring layers of the redistribution structure 144a and the conductive bumps 144c, in accordance with some embodiments.

The conductive bumps 150 are made of a solder material, such as Sn and Ag or another suitable conductive material (e.g., gold), in accordance with some embodiments. The conductive bumps 150 are solder balls, in accordance with some embodiments.

As shown in FIG. 1A, an underfill layer 162 is formed between the chip 142 and the redistribution structure 120, in accordance with some embodiments. The underfill layer 162 surrounds the conductive bumps 150 and the conductive pads 128 under the chip 142, in accordance with some embodiments. The underfill layer 162 is made of an insulating material, such as a polymer material or a molding compound material consisting of epoxy and filler material, in accordance with some embodiments.

As shown in FIG. 1A, an underfill layer 164 is formed between the chip package 144 and the redistribution structure 120, in accordance with some embodiments. The underfill layer 164 surrounds the conductive bumps 150 and the conductive pads 128 under the chip package 144, in accordance with some embodiments. The underfill layer 164 is made of an insulating material, such as a polymer material or a molding compound material consisting of epoxy and filler material, in accordance with some embodiments.

In some embodiments, a molding material layer (not shown) is formed over the chip structures 140, the underfill layers 162 and 164, and the redistribution structure 120. The molding material layer fills gaps between the chip structures 140, in accordance with some embodiments. The molding material layer in the gaps surrounds the chip structures 140, in accordance with some embodiments. The molding material layer is made of a polymer material or another suitable insulating material. In some embodiments, a thermal process is performed on the molding material layer to cure the molding material layer.

As shown in FIG. 1A, an upper portion of the molding material layer is removed to form a molding layer 170, in accordance with some embodiments. After the removal process, a top surface 172 of the molding layer 170 is substantially coplanar with or aligned with the top surface S3 of the substrate 142a, the top surface S4 of the chip 144b, and the top surface S5 of the molding layer 144d, in accordance with some embodiments. The removal process includes a chemical mechanical polishing process, in accordance with some embodiments.

Figure 1B:
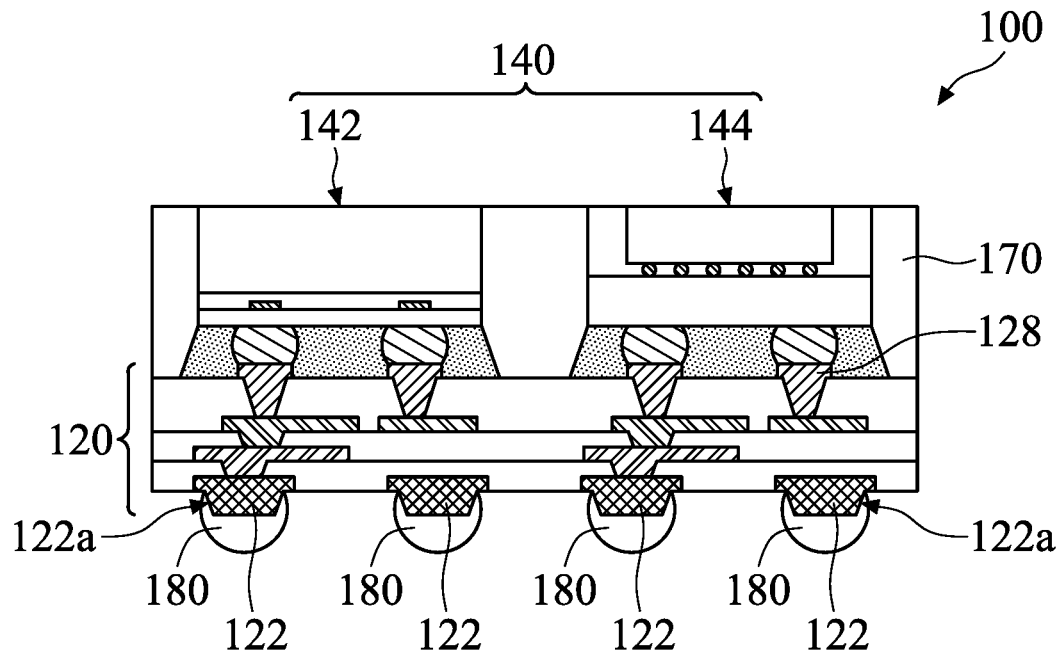

As shown in FIG. 1B, the carrier substrate 110 and the adhesive layer A1 are removed, in accordance with some embodiments. As shown in FIG. 1B, the dielectric layer 121 is removed to expose sidewalls 122a of the pads 122, in accordance with some embodiments. As shown in FIG. 1B, conductive bumps 180 are respectively formed over the conductive pads 122, in accordance with some embodiments. The conductive bumps 180 are made of a solder material, such as Sn and Ag or another suitable conductive material, in accordance with some embodiments.

As shown in FIG. 1B, a sawing process is performed on the molding layer 170 and the redistribution structure 120 to cut through the molding layer 170 and the redistribution structure 120 so as to form chip packages 100, in accordance with some embodiments. For the sake of simplicity, FIG. 1B only shows one of the chip packages 100, in accordance with some embodiments.

In some embodiments, an average distance between adjacent conductive pads 122 is greater than an average distance between adjacent conductive pads 128. Therefore, the redistribution structure 120 is also referred to as a fanout interposer. The chip package 100 is also referred to as a fanout chip package.

Figure 1C:
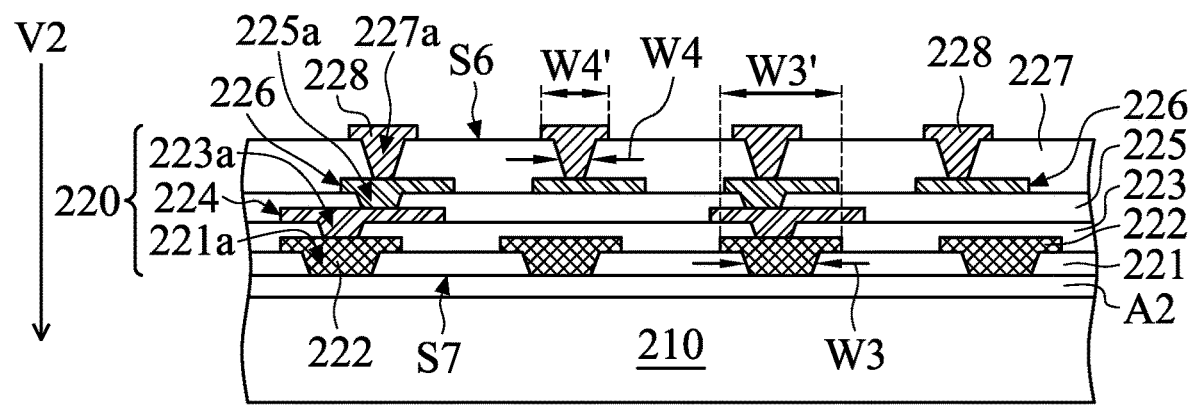

As shown in FIG. 1C, a carrier substrate 210 is provided, in accordance with some embodiments. The carrier substrate 210 is configured to provide temporary mechanical and structural support during subsequent processing steps, in accordance with some embodiments. The carrier substrate 210 includes glass, silicon, silicon oxide, aluminum oxide, metal, a combination thereof, and/or the like, in accordance with some embodiments. The carrier substrate 210 includes a metal frame, in accordance with some embodiments.

As shown in FIG. 1C, an adhesive layer A2 is formed over the carrier substrate 210, in accordance with some embodiments. The adhesive layer A2 is in direct contact with the carrier substrate 210, in accordance with some embodiments. The adhesive layer A2 is conformally formed on the carrier substrate 210, in accordance with some embodiments. The adhesive layer A2 is made of an insulating material, such as a polymer material, in accordance with some embodiments. The adhesive layer A2 is formed using a coating process or another suitable process.

As shown in FIG. 1C, a redistribution structure 220 is formed over the adhesive layer A2, in accordance with some embodiments. The redistribution structure 220 has surfaces S6 and S7, in accordance with some embodiments. The surface S6 is opposite to the surface S7, in accordance with some embodiments. The surface S7 faces the carrier substrate 210, in accordance with some embodiments.

The formation of the redistribution structure 220 includes forming a dielectric layer 221 over the adhesive layer A2; forming conductive pads 222 over the dielectric layer 221 and in through holes 221a of the dielectric layer 221; forming a dielectric layer 223 over the dielectric layer 221 and the conductive pads 222; forming a wiring layer 224 over the dielectric layer 223 and in through holes 223a of the dielectric layer 223; forming a dielectric layer 225 over the dielectric layer 223 and the wiring layer 224; forming a wiring layer 226 over the dielectric layer 225 and in through holes 225a of the dielectric layer 225; forming a dielectric layer 227 over the dielectric layer 225 and the wiring layer 226; and forming conductive pads 228 over the dielectric layer 227 and in through holes 227a of the dielectric layer 227.

The dielectric layer 221 is in direct contact with the adhesive layer A2, in accordance with some embodiments. The dielectric layer 221 is conformally formed on the adhesive layer A2, in accordance with some embodiments. In some embodiments, a width W3 of the conductive pad 222 in the dielectric layer 221 decreases along a direction V2 from the surface S6 to the surface S7.

In some embodiments, a width W4 of the conductive pad 228 in the dielectric layer 227 decreases along the direction V2. The conductive pad 222 is wider than the conductive pad 228, in accordance with some embodiments. For example, a maximum width W3' of the conductive pad 222 is greater than a maximum width W4' of the conductive pad 228. The wiring layers 224 and 226 are electrically connected to each other, in accordance with some embodiments. The conductive pads 222 and 228 are electrically connected to the wiring layers 224 and 226, in accordance with some embodiments.

The dielectric layers 221, 223, 225, and 227 are made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layers 221, 223, 225, and 227 are made of an insulating material, which does not contain a fiber material (e.g. glass fibers), in accordance with some embodiments. The wiring layers 224 and 226 and the conductive pads 222 and 228 are made of a conductive material, such as metal (e.g. copper, aluminum, or tungsten), in accordance with some embodiments.

Figure 1D:
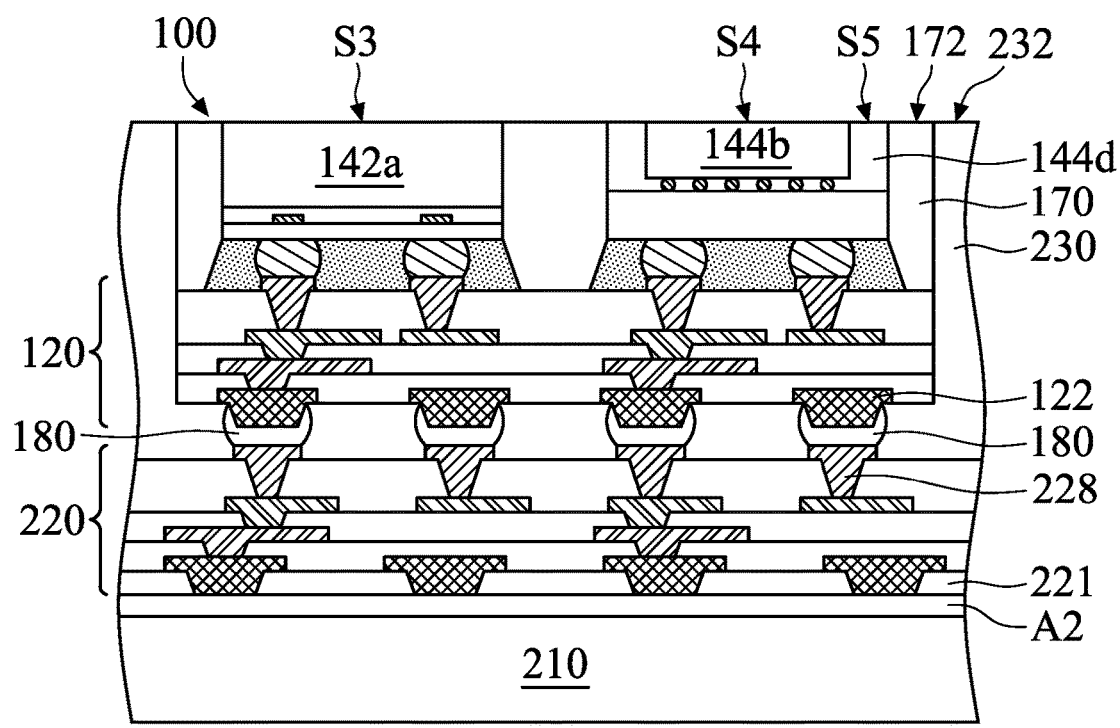

As shown in FIG. 1D, the chip package 100 is bonded to the redistribution structure 220 through the conductive bumps 180, in accordance with some embodiments. The conductive bumps 180 are between the conductive pads 122 and 228, in accordance with some embodiments. The conductive bumps 180 electrically connect the conductive pads 122 to the conductive pads 228, in accordance with some embodiments. The conductive bumps 180 are in direct contact with the conductive pads 122 and 228, in accordance with some embodiments.

As shown in FIG. 1D, a molding layer 230 is formed over the redistribution structure 220, in accordance with some embodiments. The molding layer 230 surrounds the chip package 100 and the conductive bumps 180, in accordance with some embodiments. The molding layer 230 is in direct contact with the chip package 100 and the conductive bumps 180, in accordance with some embodiments. The molding layer 230 is in direct contact with the molding layer 170 and the redistribution structure 120, in accordance with some embodiments. The molding layer 230 is made of a polymer material or another suitable insulating material. In some embodiments, a thermal process is performed on the molding layer 230 to cure the molding layer 230.

The formation of the molding layer 230 includes: forming a molding material layer (not shown) over the redistribution structure 220 and the chip package 100; and removing the molding material layer over the chip package 100 by performing, for example, a chemical mechanical process. A top surface 232 of the molding layer 230 is substantially coplanar with or aligned with the top surface 172 of the molding layer 170, the top surface S3 of the substrate 142a, the top surface S4 of the chip 144b, and the top surface S5 of the molding layer 144d, in accordance with some embodiments.

Figure 1E:
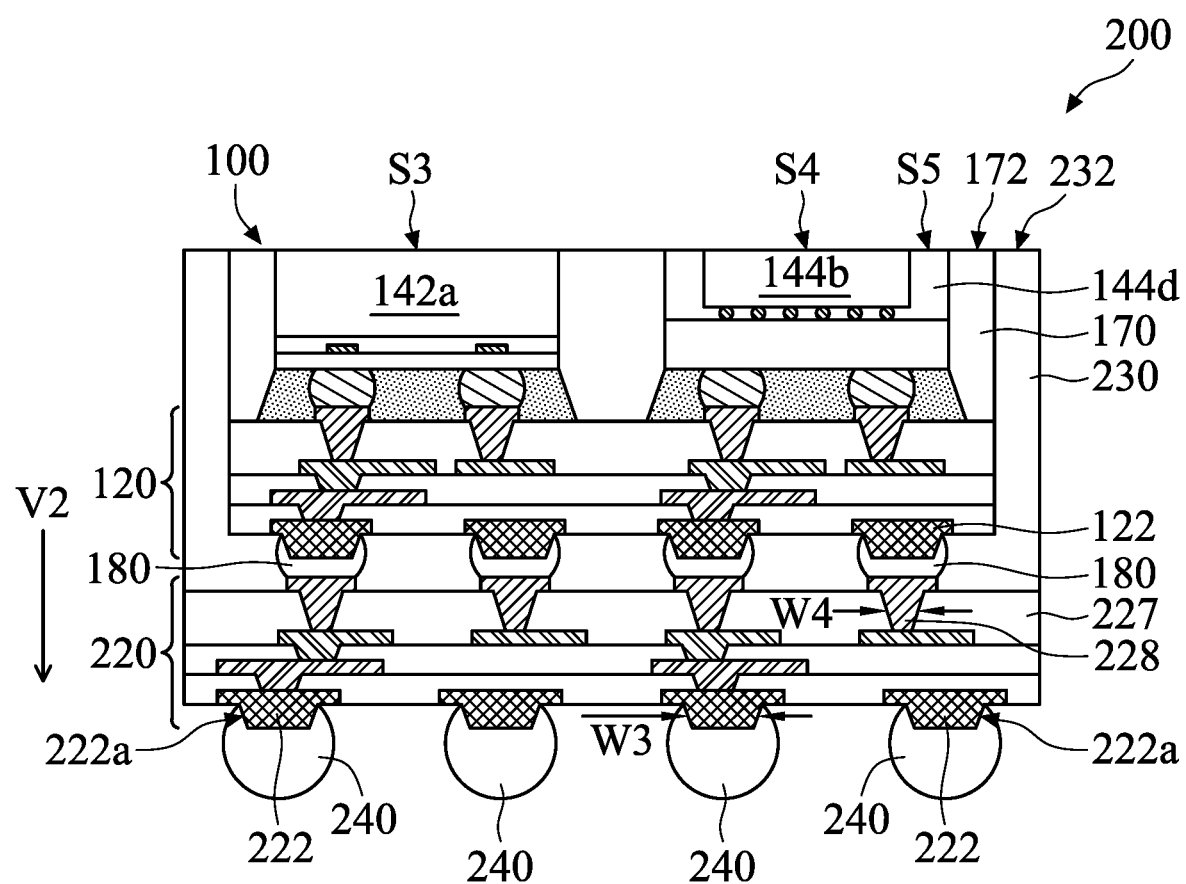

As shown in FIGS. 1D and 1E, the carrier substrate 210 and the adhesive layer A2 are removed, in accordance with some embodiments. As shown in FIGS. 1D and 1E, the dielectric layer 221 is removed to expose sidewalls 222a of the pads 222, in accordance with some embodiments. As shown in FIG. 1E, conductive bumps 240 are respectively formed over the conductive pads 222, in accordance with some embodiments. The conductive bumps 240 are made of a solder material, such as Sn and Ag or another suitable conductive material, in accordance with some embodiments.

As shown in FIG. 1E, a sawing process is performed on the molding layer 230 and the redistribution structure 220 to cut through the molding layer 230 and the redistribution structure 220 so as to form chip package structures 200, in accordance with some embodiments. For the sake of simplicity, FIG. 1E only shows one of the chip package structures 200, in accordance with some embodiments. In some embodiments, an average distance between adjacent conductive pads 222 is greater than an average distance between adjacent conductive pads 228. Therefore, the redistribution structure 220 is also referred to as a fanout interposer.

Since the redistribution structure 220 is formed over the carrier substrate 210 using layer by layer deposition (as shown in FIG. 1D), the planarity of the redistribution structure 220 is better than a wiring substrate, which includes a core layer and insulating layers formed thereon. Therefore, the yield of the bonding process between the chip package 100 and the redistribution structure 220 is improved.

Furthermore, the feature size (e.g. the line width or the average distance between adjacent conductive bumps 180 or 240) of the redistribution structure 220 is less than that of the wiring substrate. Therefore, the wiring density and the conductive bump density of the redistribution structure 220 are greater than that of the wiring substrate. As a result, the signal transmission and the power connection efficiency of the redistribution structure 220 are better than that of the wiring substrate.

The line width of the redistribution structure 220 ranges from about 1.5 μm to about 15 μm, in accordance with some embodiments. The average distance between adjacent conductive bumps 180 ranges from about 22 μm to about 200 μm, in accordance with some embodiments. The average distance between adjacent conductive bumps 240 ranges from about 70 μm to about 250 μm, in accordance with some embodiments.

In some embodiments, the width W3 of the conductive pad 222 decreases along the direction V2 away from the chip package 100. In some embodiments, the width W4 of the conductive pad 228 in the dielectric layer 227 decreases along the direction V2.

Figure 1F:
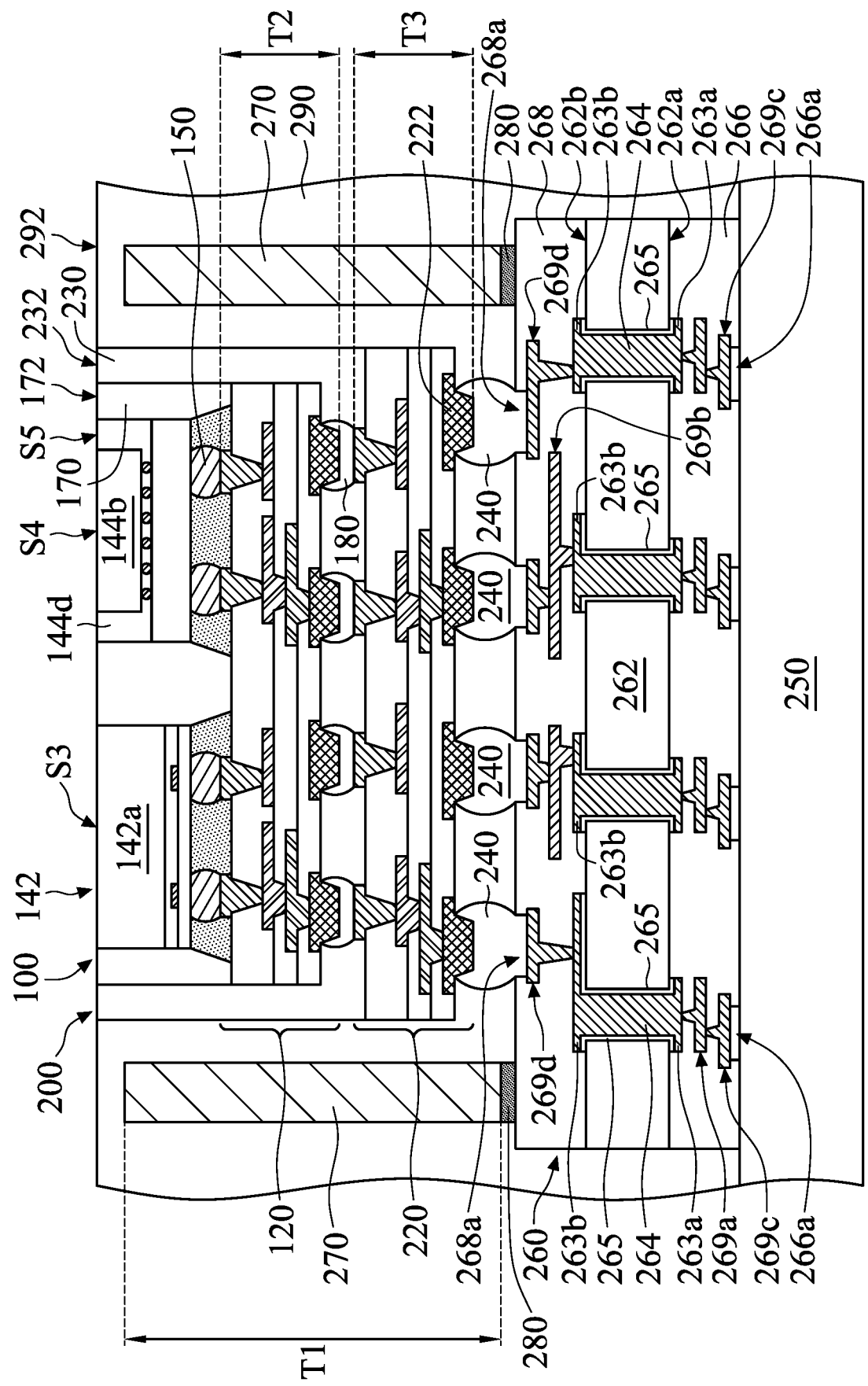

As shown in FIG. 1F, a carrier substrate 250 is provided, in accordance with some embodiments. The carrier substrate 250 is configured to provide temporary mechanical and structural support during subsequent processing steps, in accordance with some embodiments. The carrier substrate 250 includes glass, silicon, silicon oxide, aluminum oxide, metal, a combination thereof, and/or the like, in accordance with some embodiments. The carrier substrate 250 includes a metal frame, in accordance with some embodiments.

As shown in FIG. 1F, a substrate 260 is disposed over the carrier substrate 250, in accordance with some embodiments. The substrate 260 includes a core layer 262, conductive pads 263a, 263b, 269c, and 269d, conductive via structures 264, insulating layers 265, 266, and 268, and wiring layers 269a and 269b, in accordance with some embodiments. The core layer 262 has two opposite surfaces 262a and 262b, in accordance with some embodiments. The surface 262a faces the carrier substrate 250, in accordance with some embodiments.

The core layer 262 is made of a fiber material, a polymer material, a semiconductor material, a glass material, a metal material, or another suitable material. The fiber material includes, for example, a glass fiber material. The semiconductor material includes, for example, silicon or germanium.

The conductive pads 263a are over the surface 262a, in accordance with some embodiments. The conductive pads 263b are over the surface 262b, in accordance with some embodiments. The conductive via structures 264 pass through the core layer 262, in accordance with some embodiments. The conductive via structures 264 are between and connected to the conductive pads 263a and 263b, in accordance with some embodiments.

The insulating layer 265 is between the conductive via structures 264 and the core layer 262, between the conductive pads 263a and the core layer 262, and between the conductive pads 263b and the core layer 262, in accordance with some embodiments. The conductive pads 263a and 263b and the conductive via structures 264 are electrically insulated from the core layer 262 by the insulating layer 265, in accordance with some embodiments.

The insulating layer 266 is formed over the surface 262a, in accordance with some embodiments. The wiring layers 269a are formed in the insulating layer 266 and are electrically connected to the conductive pads 263a and the conductive via structures 264, in accordance with some embodiments. The conductive pads 269c are formed in the insulating layer 266 and are electrically connected to the wiring layers 269a, in accordance with some embodiments. The insulating layer 266 has openings 266a respectively exposing the conductive pads 269c, in accordance with some embodiments.

The insulating layer 268 is formed over the surface 262b, in accordance with some embodiments. The wiring layers 269b are formed in the insulating layer 268 and are electrically connected to the conductive pads 263b and the conductive via structures 264, in accordance with some embodiments. The conductive pads 269d are formed in the insulating layer 268 and are electrically connected to the wiring layers 269b, in accordance with some embodiments.

The insulating layer 268 has openings 268a respectively exposing the conductive pads 269d thereunder, in accordance with some embodiments. The conductive via structures 264, the conductive pads 263a, 263b, 269c, and 269d, and the wiring layers 269a and 269b are made of a conductive material, such as copper, aluminum, or tungsten, in accordance with some embodiments. The insulating layers 265, 266, and 268 are made of an insulating material, such as oxide (e.g., silicon oxide), in accordance with some embodiments.

As shown in FIG. 1F, the chip package structure 200 is bonded to the substrate 260 through the conductive bumps 240, in accordance with some embodiments. The conductive bumps 240 electrically connect the conductive pads 222 to the conductive pads 269d, in accordance with some embodiments. The conductive bump 240 is wider than the conductive bump 180, in accordance with some embodiments. The conductive bump 180 is wider than the conductive bump 150, in accordance with some embodiments.

Thereafter, as shown in FIG. 1F, a ring structure 270 is bonded to the substrate 260 through an adhesive layer 280, in accordance with some embodiments. The ring structure 270 continuously surrounds the entire chip package structure 200, in accordance with some embodiments. The ring structure 270 is configured as an anti-warpage structure to reduce the warpage of the substrate 260 during subsequent processes, in accordance with some embodiments.

In some embodiments, a thickness T1 of the ring structure 270 is greater than the sum of a thickness T2 of the redistribution structure 120 and a thickness T3 of the redistribution structure 220. The ring structure 270 is made of metal (e.g. copper) or another suitable material, in accordance with some embodiments. The adhesive layer 280 is made of a polymer material or another suitable insulating material, in accordance with some embodiments.

As shown in FIG. 1F, a molding layer 290 is formed over the carrier substrate 250, the substrate 260, and the ring structure 270, in accordance with some embodiments. The molding layer 290 surrounds the substrate 260, the ring structure 270, the conductive bumps 240, and the chip package structure 200, in accordance with some embodiments.

In some embodiments, a top surface 292 of the molding layer 290 is substantially coplanar with or aligned with the top surface 232 of the molding layer 230, the top surface 172 of the molding layer 170, the top surface S3 of the substrate 142a, the top surface S4 of the chip 144b, and the top surface S5 of the molding layer 144d, in accordance with some embodiments.

Since the top surface S3 of the substrate 142a and the top surface S4 of the chip 144b are exposed by the molding layers 144d, 170, 230, and 290, the heat dissipation efficiency of the chips 142 and 144b are improved, in accordance with some embodiments. The molding layer 290 is made of a polymer material or another suitable insulating material. In some embodiments, a thermal process is performed on the molding layer 290 to cure the molding layer 290.

Figure 1G:
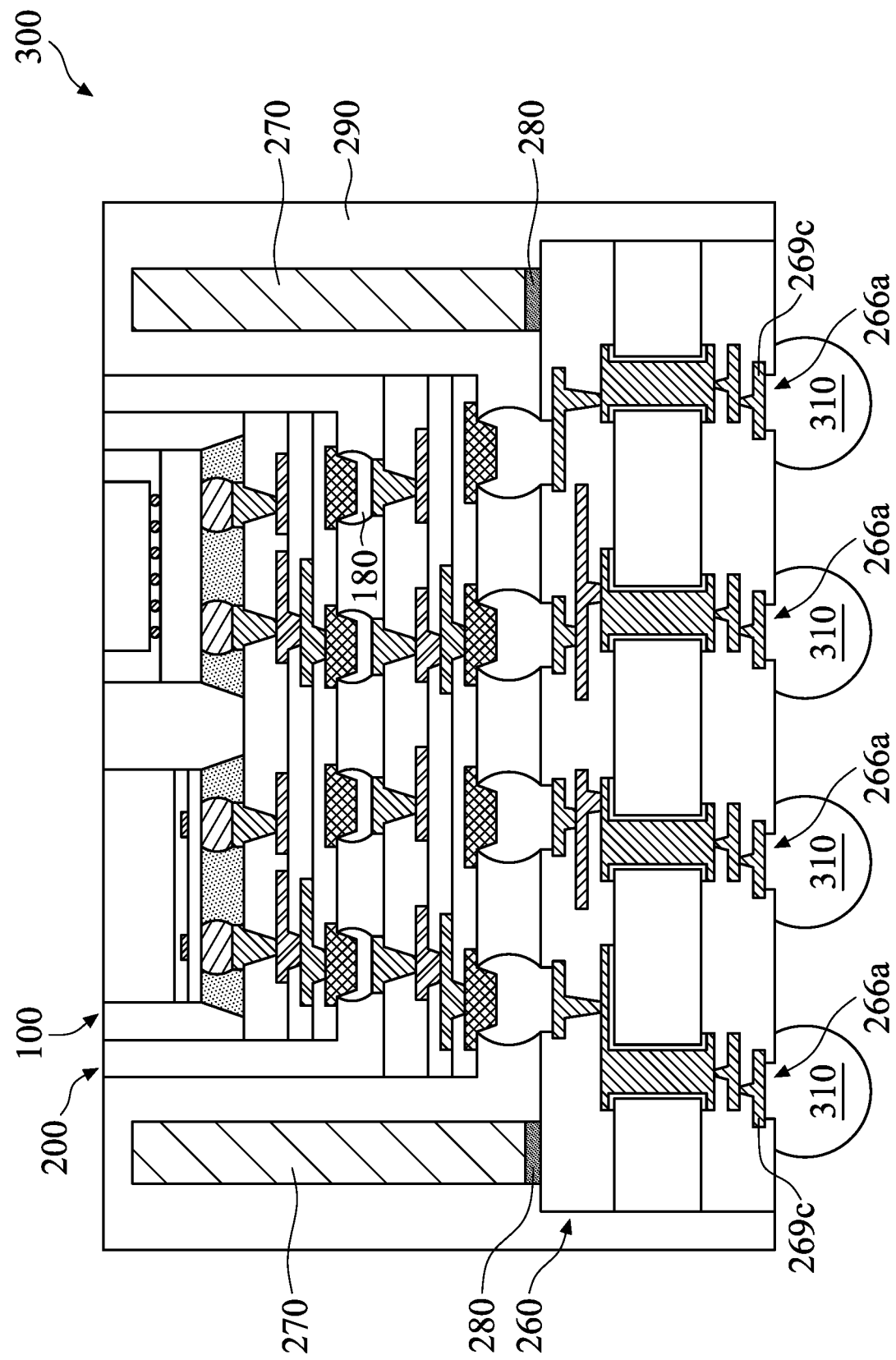

As shown in FIGS. 1F and 1G, the carrier substrate 250 is removed, in accordance with some embodiments. As shown in FIG. 1G, conductive bumps 310 are respectively formed over the conductive pads 269c, in accordance with some embodiments. The conductive bumps 310 are made of a solder material, such as Sn and Ag or another suitable conductive material, in accordance with some embodiments.

As shown in FIG. 1G, a sawing process is performed on the molding layer 290 to cut through the molding layer 290 so as to form chip package structures 300, in accordance with some embodiments. For the sake of simplicity, FIG. 1G only shows one of the chip package structures 300, in accordance with some embodiments.

Figure 2:
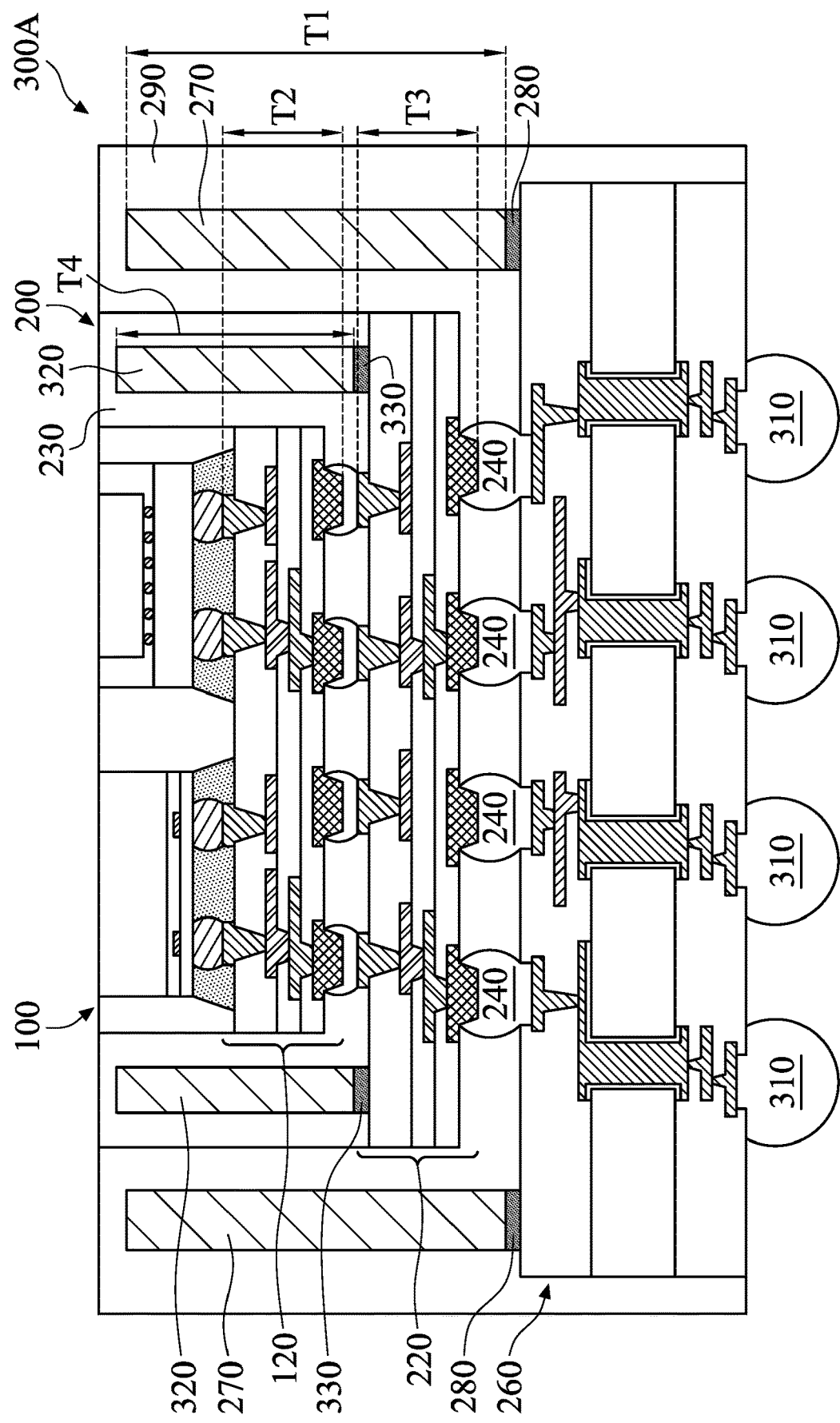
FIG. 2 is a cross-sectional view of a chip package structure, in accordance with some embodiments.

FIG. 2 is a cross-sectional view of a chip package structure 300A, in accordance with some embodiments. As shown in FIG. 2, the chip package structure 300A is similar to the chip package structure 300 in FIG. 1G, except that the chip package structure 300A further includes a ring structure 320, in accordance with some embodiments. The ring structure 320 is bonded to the redistribution structure 220 through an adhesive layer 330, in accordance with some embodiments.

The ring structure 320 and the adhesive layer 330 continuously surround the entire chip package 100, in accordance with some embodiments. The ring structure 320 is configured as an anti-warpage structure to reduce the warpage of the redistribution structure 220 during subsequent processes, in accordance with some embodiments. In some embodiments, a thickness T4 of the ring structure 320 is greater than the thickness T2 of the redistribution structure 120. In some embodiments, the thickness T4 of the ring structure 320 is greater than the thickness T3 of the redistribution structure 220. In some embodiments, the thickness T4 of the ring structure 320 is less than the thickness T1 of the ring structure 270.

The ring structure 320 is made of metal (e.g. copper) or another suitable material, in accordance with some embodiments. The adhesive layer 330 is made of a polymer material or another suitable insulating material, in accordance with some embodiments. The molding layer 230 covers and surrounds the ring structure 320 and the adhesive layer 330, in accordance with some embodiments. The molding layer 230 is in direct contact with the ring structure 320 and the adhesive layer 330, in accordance with some embodiments.

The formation of the ring structure 320 includes: bonding the ring structure 320 to the redistribution structure 220 through the adhesive layer 330 after bonding the chip package 100 (of FIG. 1B) to the redistribution structure 220 (of FIG. 1C) and before forming the molding layer 230 over the redistribution structure 220 (as shown in FIG. 1D).

Figure 3:
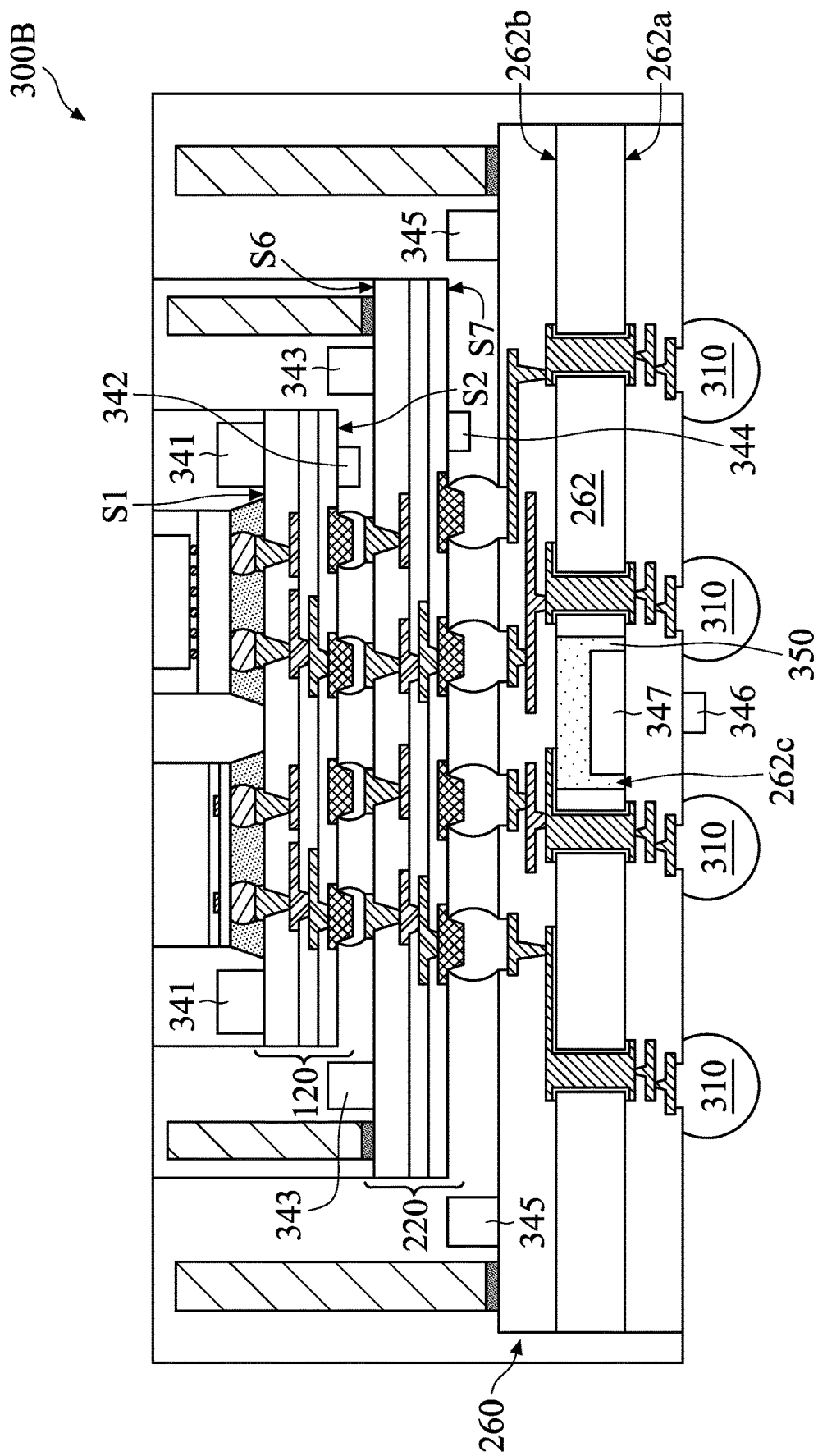
FIG. 3 is a cross-sectional view of a chip package structure, in accordance with some embodiments.

FIG. 3 is a cross-sectional view of a chip package structure 300B, in accordance with some embodiments. As shown in FIG. 3, the chip package structure 300B is similar to the chip package structure 300A in FIG. 2, except that the chip package structure 300B further includes passive devices 341, 342, 343, 344, 345, 346, and 347, in accordance with some embodiments.

The passive devices 341 are disposed over the surface S1 of the redistribution structure 120, in accordance with some embodiments. The passive devices 342 are disposed over the surface S2 of the redistribution structure 120, in accordance with some embodiments. The passive devices 343 are disposed over the surface S6 of the redistribution structure 220, in accordance with some embodiments. The passive devices 344 are disposed over the surface S7 of the redistribution structure 220, in accordance with some embodiments.

The passive devices 345 are disposed over the surface 262b of the core layer 262, in accordance with some embodiments. The passive devices 346 are disposed over the surface 262a of the core layer 262, in accordance with some embodiments. The core layer 262 has an opening 262c, in accordance with some embodiments. The passive devices 347 are in the opening 262c, in accordance with some embodiments. The passive devices 341, 342, 343, 344, 345, 346, and 347 include capacitors, inductors, resistors or another suitable device, in accordance with some embodiments. In some embodiments, a filling layer 350 is filled into the opening 262c. The filling layer 350 is made of an insulating material, in accordance with some embodiments.

Figure 4A:
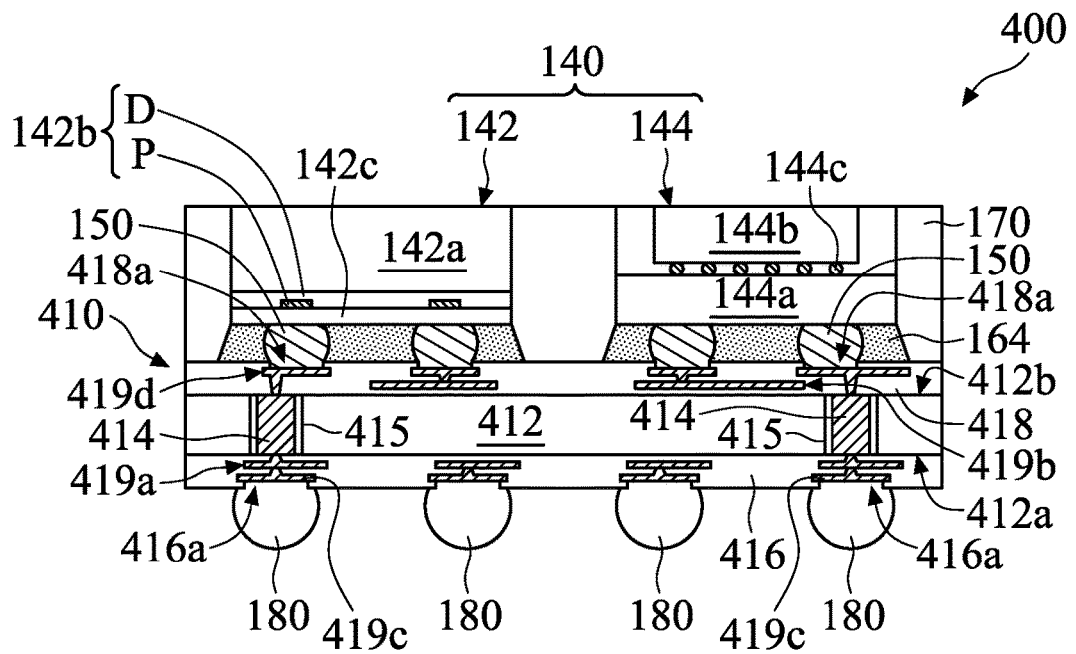
FIGS. 4A-4F are cross-sectional views of various stages of a process for forming a chip package structure, in accordance with some embodiments.

FIGS. 4A-4F are cross-sectional views of various stages of a process for forming a chip package structure, in accordance with some embodiments. As shown in FIG. 4A, a chip package structure 400 is provided, in accordance with some embodiments. The chip package structure 400 is similar to the chip package 100 of FIG. 1B, except that the chip package structure 400 further includes an interposer substrate 410 and does not include the redistribution structure 120 of the chip package 100 of FIG. 1B, in accordance with some embodiments.

The interposer substrate 410 includes a core layer 412, conductive pads 419c and 419d, conductive via structures 414, insulating layers 415, 416, and 418, and wiring layers 419a and 419b, in accordance with some embodiments. The core layer 412 has two opposite surfaces 412a and 412b, in accordance with some embodiments.

The core layer 412 is made of a semiconductor material, a glass material, a metal material, a fiber material, a polymer material, or another suitable material. The semiconductor material includes, for example, silicon or germanium. The fiber material includes, for example, a glass fiber material.

The conductive via structures 414 pass through the core layer 412, in accordance with some embodiments. The insulating layer 415 is between the conductive via structures 414 and the core layer 412, in accordance with some embodiments. The conductive via structures 414 are electrically insulated from the core layer 412 by the insulating layer 415, in accordance with some embodiments.

The insulating layer 416 is formed over the surface 412a, in accordance with some embodiments. The wiring layers 419a are formed in the insulating layer 416 and are electrically connected to the conductive via structures 414, in accordance with some embodiments. The conductive pads 419c are formed in the insulating layer 416 and are electrically connected to the wiring layers 419a, in accordance with some embodiments. The insulating layer 416 has openings 416a respectively exposing the conductive pads 419c, in accordance with some embodiments.

The insulating layer 418 is formed over the surface 412b, in accordance with some embodiments. The wiring layers 419b are formed in the insulating layer 418 and are electrically connected to the conductive via structures 414, in accordance with some embodiments. The conductive pads 419d are formed in the insulating layer 418 and are electrically connected to the wiring layers 419b, in accordance with some embodiments.

The insulating layer 418 has openings 418a respectively exposing the conductive pads 419d thereunder, in accordance with some embodiments. The conductive via structures 414 are electrically connected to the conductive pads 419c and 419d, in accordance with some embodiments. The conductive via structures 414, the conductive pads 419c and 419d, and the wiring layers 419a and 419b are made of a conductive material, such as copper, aluminum, or tungsten, in accordance with some embodiments. The insulating layers 415, 416, and 418 are made of an insulating material, such as oxide (e.g., silicon oxide), in accordance with some embodiments.

The chip structures 140 are bonded to the interposer substrate 410 through the conductive bumps 150, in accordance with some embodiments. Some of the conductive bumps 150 are between the conductive pads 419d and the interconnect layer 142c to electrically connect the conductive pads 419d to the conductive pads P through the interconnect structure (not shown) of the interconnect layer 142c, in accordance with some embodiments. Some other conductive bumps 150 are between the conductive pads 419d and the redistribution structure 144a to electrically connect the conductive pads 419d to the chip 144b through the wiring layers (not shown) of the redistribution structure 144a and the conductive bumps 144c, in accordance with some embodiments.

As shown in FIG. 4A, conductive bumps 180 are respectively formed over the conductive pads 419c, in accordance with some embodiments. The conductive bumps 180 are made of a solder material, such as Sn and Ag or another suitable conductive material, in accordance with some embodiments.

Figure 4B:
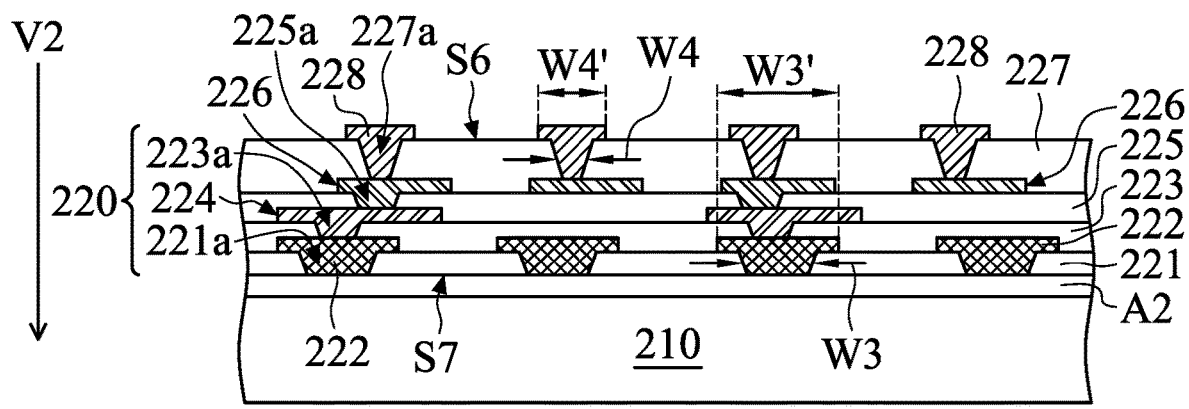

As shown in FIG. 4B, a carrier substrate 210 is provided, in accordance with some embodiments. As shown in FIG. 4B, an adhesive layer A2 is formed over the carrier substrate 210, in accordance with some embodiments. As shown in FIG. 4B, a redistribution structure 220 is formed over the adhesive layer A2, in accordance with some embodiments.

The forming method, the structure, and the materials of the carrier substrate 210, the adhesive layer A2, and the redistribution structure 220 are the same as (or similar to) that of the carrier substrate 210, the adhesive layer A2, and the redistribution structure 220 of FIG. 1C, in accordance with some embodiments.

The dielectric layer 221 is in direct contact with the adhesive layer A2, in accordance with some embodiments. The dielectric layer 221 is conformally formed on the adhesive layer A2, in accordance with some embodiments. In some embodiments, a width W3 of the conductive pad 222 in the dielectric layer 221 decreases along a direction V2 from the surface S6 to the surface S7.

In some embodiments, a width W4 of the conductive pad 228 in the dielectric layer 227 decreases along the direction V2. The conductive pad 222 is wider than the conductive pad 228, in accordance with some embodiments. For example, a maximum width W3' of the conductive pad 222 is greater than a maximum width W4' of the conductive pad 228. The wiring layers 224 and 226 are electrically connected to each other, in accordance with some embodiments. The conductive pads 222 and 228 are electrically connected to the wiring layers 224 and 226, in accordance with some embodiments.

Figure 4C:
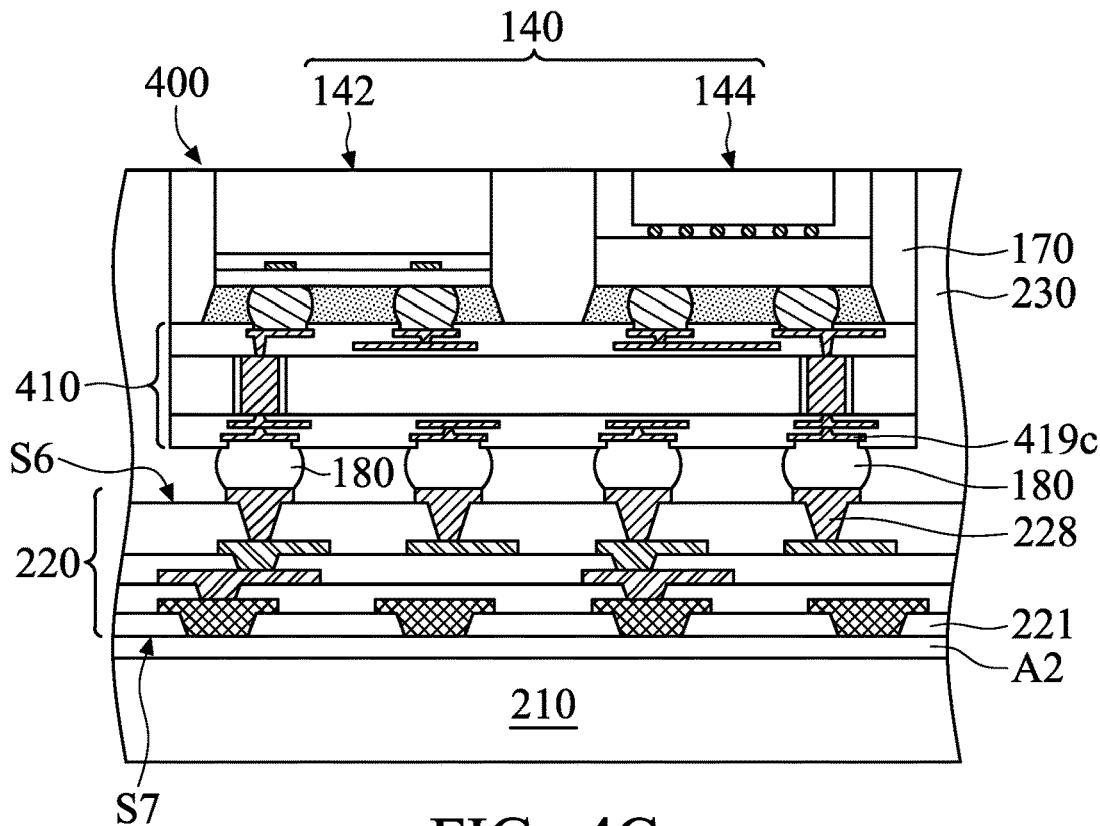

As shown in FIG. 4C, the chip package structure 400 is bonded to the redistribution structure 220 through the conductive bumps 180, in accordance with some embodiments. The conductive bumps 180 are between the conductive pads 419c and 228, in accordance with some embodiments. The conductive bumps 180 electrically connect the conductive pads 419c to the conductive pads 228, in accordance with some embodiments. The conductive bumps 180 are in direct contact with the conductive pads 419c and 228, in accordance with some embodiments.

As shown in FIG. 4C, a molding layer 230 is formed over the redistribution structure 220, in accordance with some embodiments. The molding layer 230 surrounds the chip package structure 400 and the conductive bumps 180, in accordance with some embodiments. The molding layer 230 is in direct contact with the chip package structure 400 and the conductive bumps 180, in accordance with some embodiments.

The molding layer 230 is in direct contact with the molding layer 170 and the interposer substrate 410, in accordance with some embodiments. The molding layer 230 is made of a polymer material or another suitable insulating material. In some embodiments, a thermal process is performed on the molding layer 230 to cure the molding layer 230.

Figure 4D:
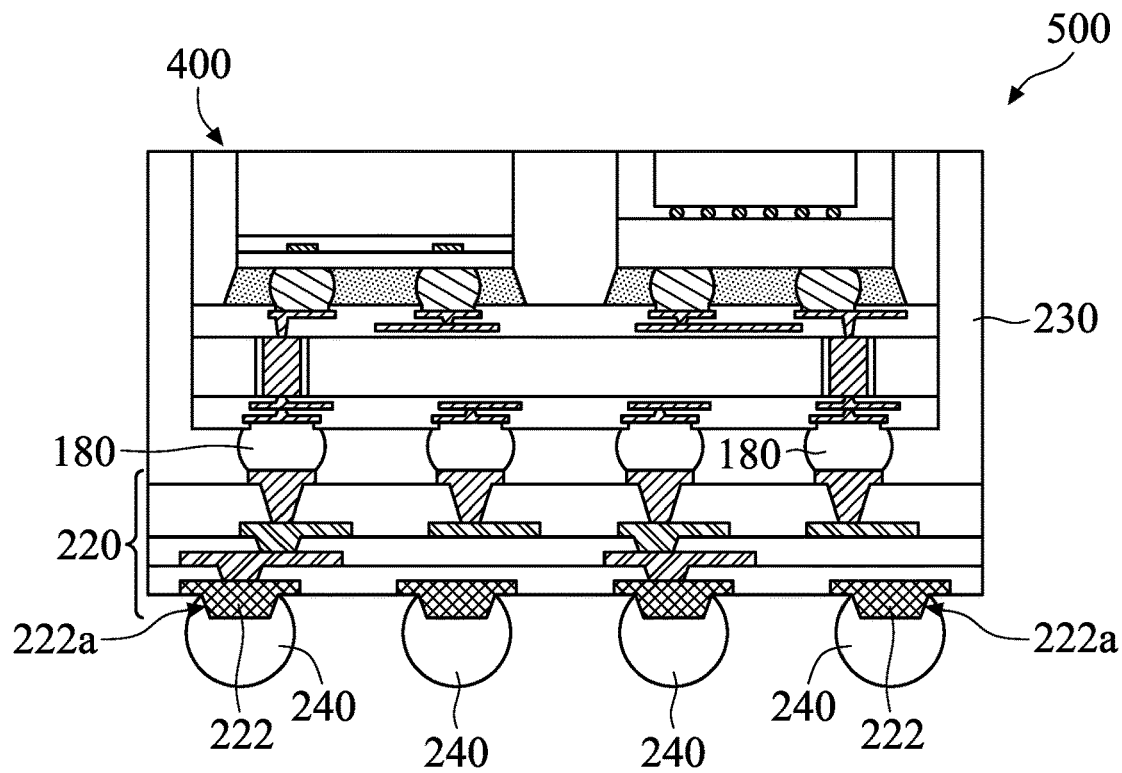

As shown in FIGS. 4C and 4D, the carrier substrate 210 and the adhesive layer A2 are removed, in accordance with some embodiments. As shown in FIGS. 4C and 4D, the dielectric layer 221 is removed to expose sidewalls 222a of the pads 222, in accordance with some embodiments. As shown in FIG. 4D, conductive bumps 240 are respectively formed over the conductive pads 222, in accordance with some embodiments. The conductive bumps 240 are made of a solder material, such as Sn and Ag or another suitable conductive material, in accordance with some embodiments.

As shown in FIG. 4D, a sawing process is performed on the molding layer 230 and the redistribution structure 220 to cut through the molding layer 230 and the redistribution structure 220 so as to form chip package structures 500, in accordance with some embodiments. For the sake of simplicity, FIG. 4D only shows one of the chip package structures 500, in accordance with some embodiments.

Figure 4E:
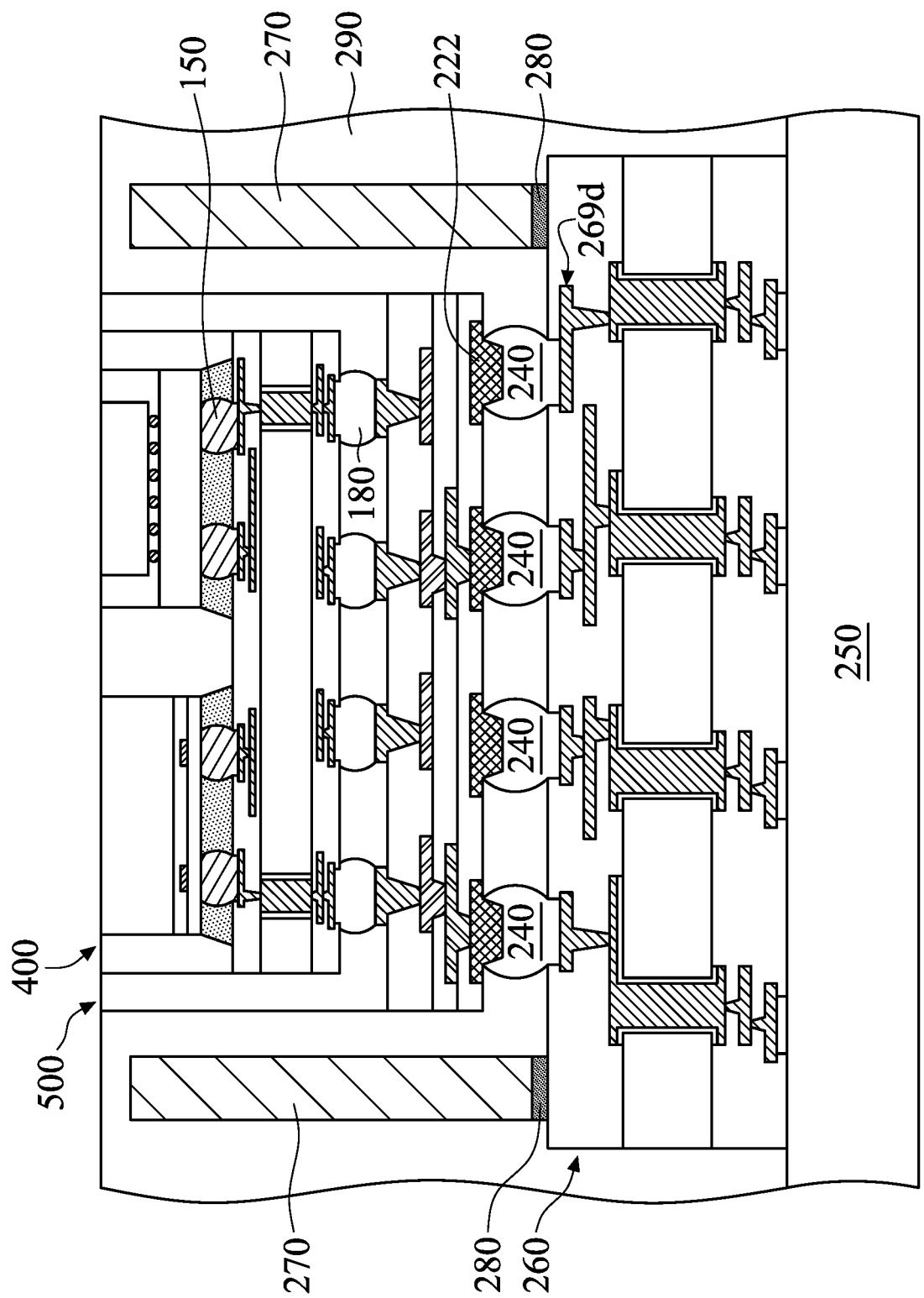

As shown in FIG. 4E, a carrier substrate 250 is provided, in accordance with some embodiments. As shown in FIG. 4E, a substrate 260 is disposed over the carrier substrate 250, in accordance with some embodiments. The forming method, the structure, and the materials of the carrier substrate 250 and the substrate 260 are the same as (or similar to) that of the carrier substrate 250 and the substrate 260 of FIG. 1F, in accordance with some embodiments.

As shown in FIG. 4E, the chip package structure 500 is bonded to the substrate 260 through the conductive bumps 240, in accordance with some embodiments. The conductive bumps 240 electrically connect the conductive pads 222 to the conductive pads 269d, in accordance with some embodiments. The conductive bump 240 is wider than the conductive bump 180, in accordance with some embodiments. The conductive bump 180 is wider than the conductive bump 150, in accordance with some embodiments.

As shown in FIG. 4E, a ring structure 270 is bonded to the substrate 260 through an adhesive layer 280, in accordance with some embodiments. The ring structure 270 continuously surrounds the entire chip package structure 500, in accordance with some embodiments. The forming method, the structure, and the materials of the ring structure 270 and the adhesive layer 280 are the same as (or similar to) that of the ring structure 270 and the adhesive layer 280 of FIG. 1F, in accordance with some embodiments.

As shown in FIG. 4E, a molding layer 290 is formed over the carrier substrate 250, the substrate 260, the ring structure 270, and the conductive bumps 240, in accordance with some embodiments. The molding layer 290 surrounds the substrate 260, the ring structure 270, the conductive bumps 240, and the chip package structure 500, in accordance with some embodiments. The molding layer 290 is made of a polymer material or another suitable insulating material. In some embodiments, a thermal process is performed on the molding layer 290 to cure the molding layer 290.

Figure 4F:
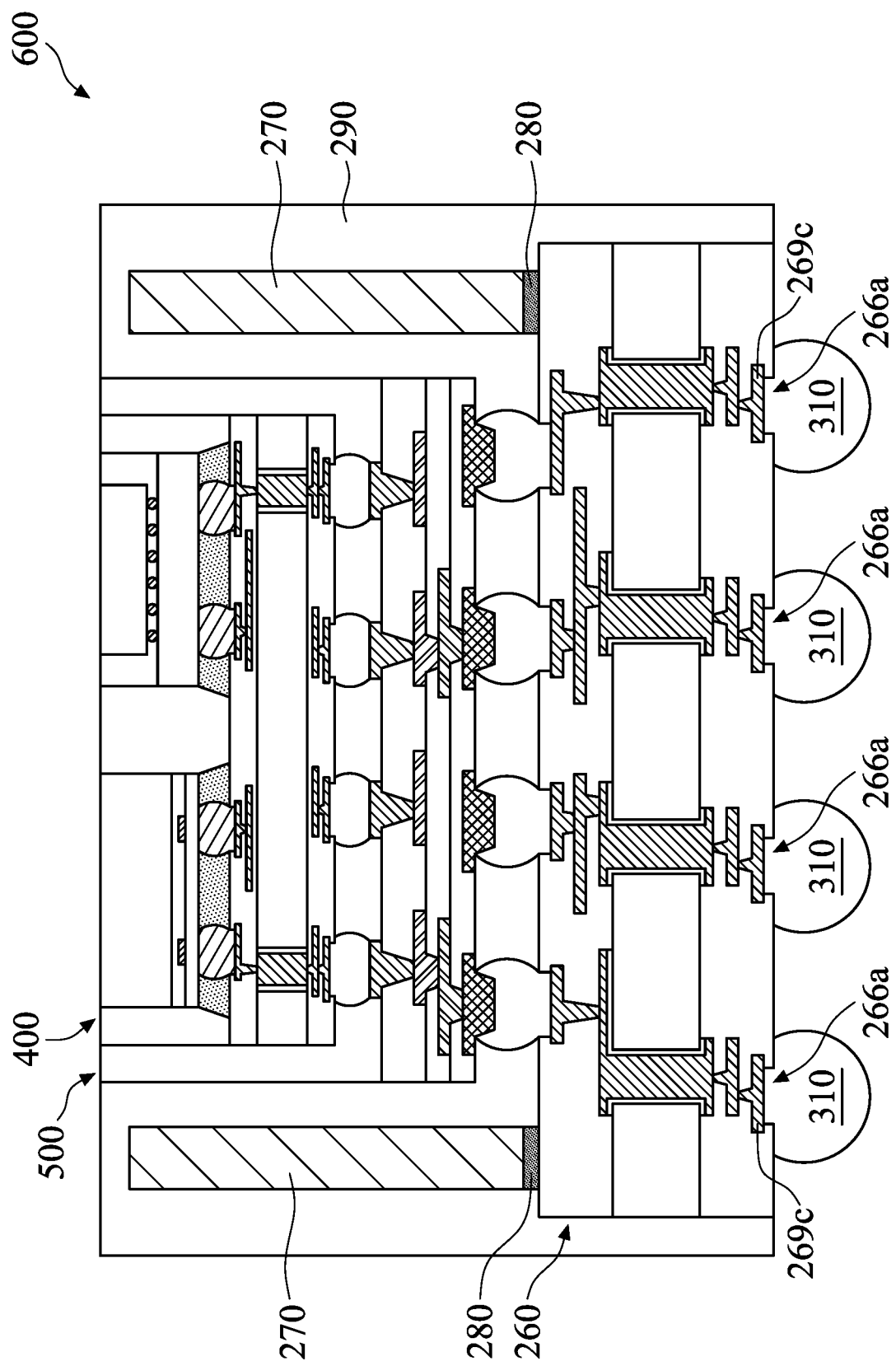

As shown in FIGS. 4E and 4F, the carrier substrate 250 is removed, in accordance with some embodiments. As shown in FIG. 4F, conductive bumps 310 are respectively formed over the conductive pads 269c, in accordance with some embodiments. The conductive bumps 310 are made of a solder material, such as Sn and Ag or another suitable conductive material, in accordance with some embodiments.

As shown in FIG. 4F, a sawing process is performed on the molding layer 290 to cut through the molding layer 290 so as to form chip package structures 600, in accordance with some embodiments. For the sake of simplicity, FIG. 4F only shows one of the chip package structures 600, in accordance with some embodiments.

Figure 5:
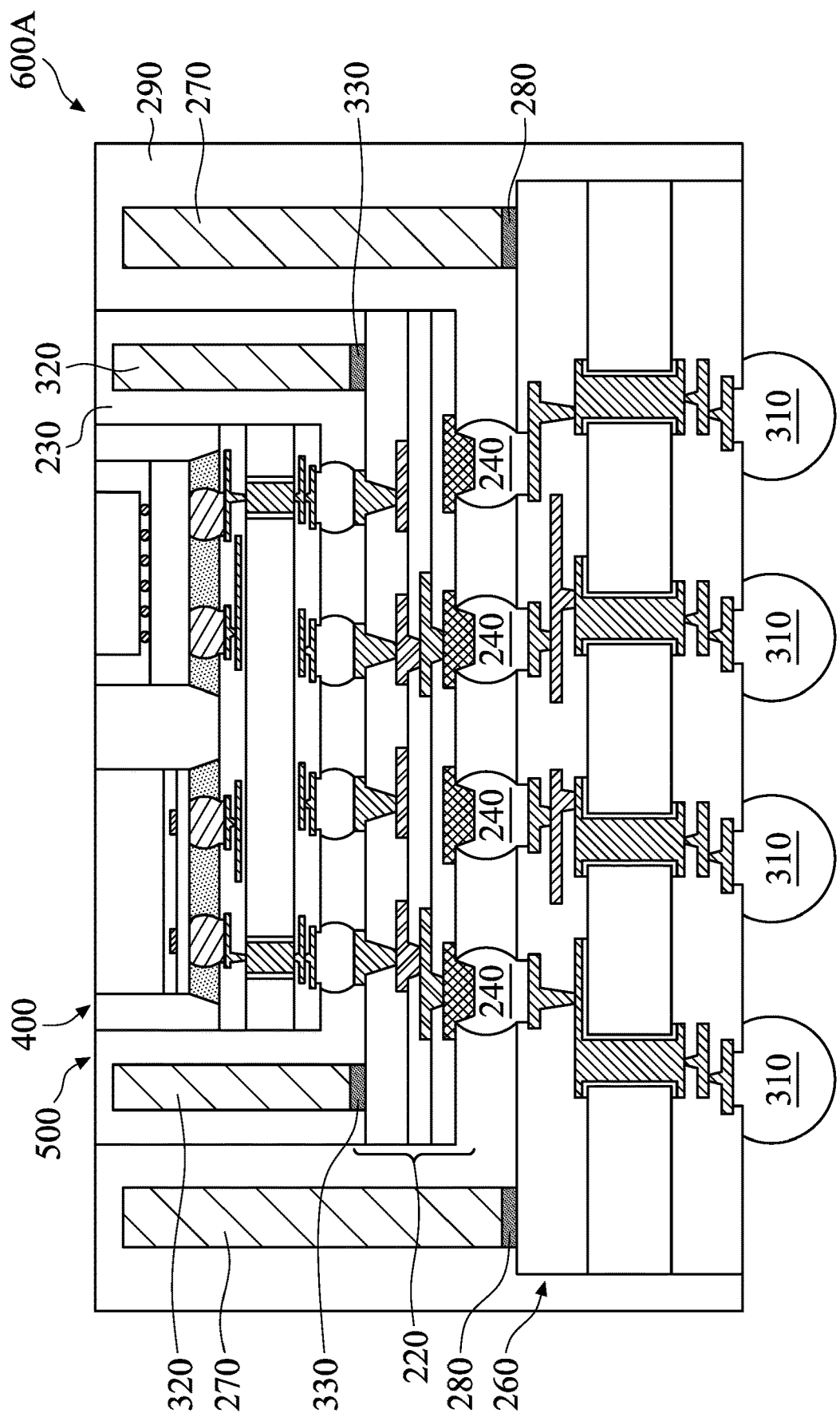
FIG. 5 is a cross-sectional view of a chip package structure, in accordance with some embodiments.

FIG. 5 is a cross-sectional view of a chip package structure 600A, in accordance with some embodiments. As shown in FIG. 5, the chip package structure 600A is similar to the chip package structure 600 in FIG. 4F, except that the chip package structure 600A further includes a ring structure 320, in accordance with some embodiments. The ring structure 320 is bonded to the redistribution structure 220 through an adhesive layer 330, in accordance with some embodiments.

The ring structure 320 and the adhesive layer 330 continuously surround the entire chip package structure 400, in accordance with some embodiments. The forming method, the structure, and the materials of the ring structure 320 and the adhesive layer 330 are the same as (or similar to) that of the ring structure 320 and the adhesive layer 330 of FIG. 2, in accordance with some embodiments.

The molding layer 230 covers and surrounds the ring structure 320 and the adhesive layer 330, in accordance with some embodiments. The molding layer 230 is in direct contact with the ring structure 320 and the adhesive layer 330, in accordance with some embodiments.

Figure 6:
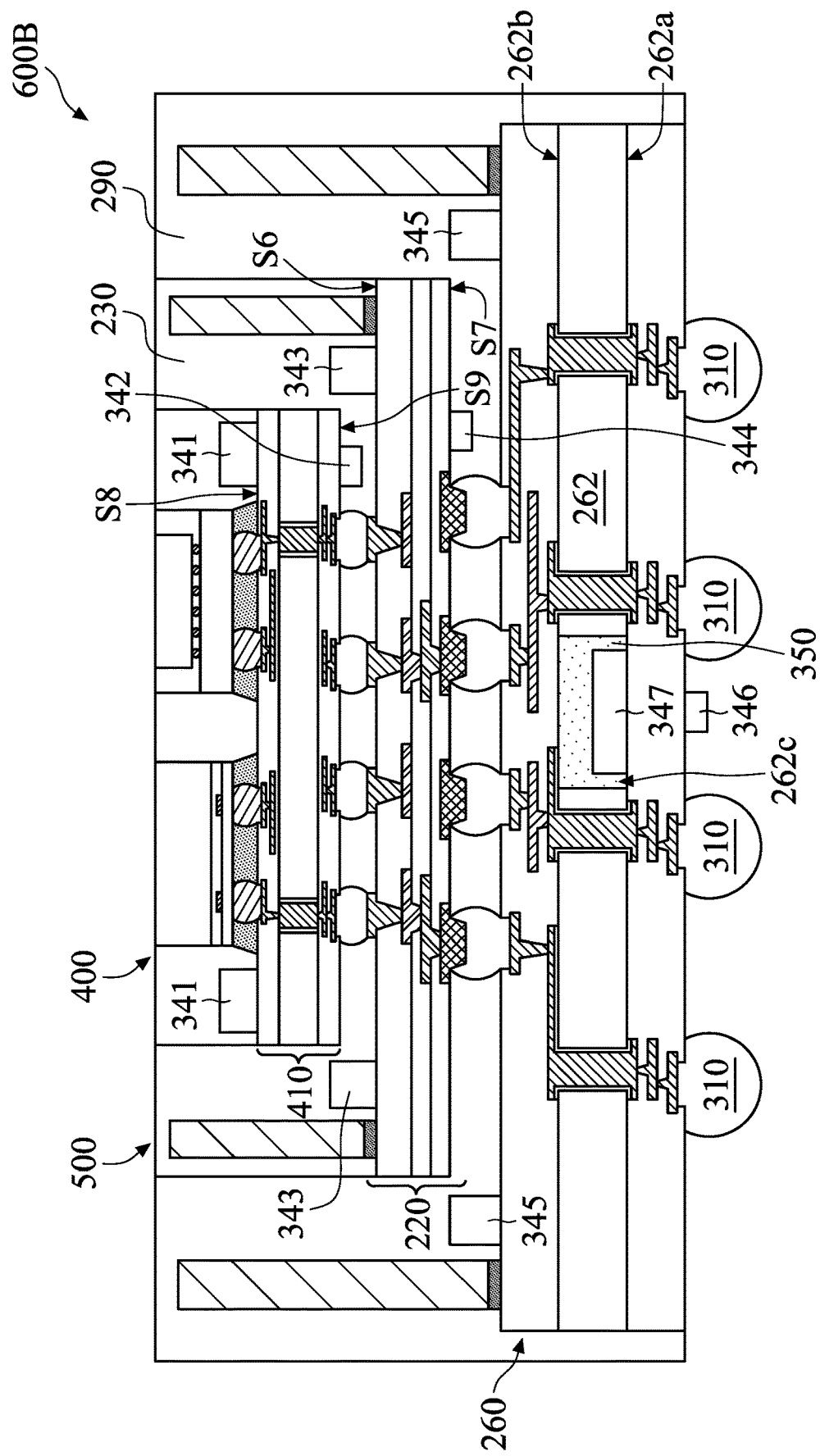
FIG. 6 is a cross-sectional view of a chip package structure, in accordance with some embodiments.

FIG. 6 is a cross-sectional view of a chip package structure 600B, in accordance with some embodiments. As shown in FIG. 6, the chip package structure 600B is similar to the chip package structure 600A in FIG. 5, except that the chip package structure 600B includes passive devices 341, 342, 343, 344, 345, 346, and 347, in accordance with some embodiments.

The passive devices 341 are disposed over the surface S8 of the interposer substrate 410, in accordance with some embodiments. The passive devices 342 are disposed over the surface S9 of the interposer substrate 410, in accordance with some embodiments. The passive devices 343 are disposed over the surface S6 of the redistribution structure 220, in accordance with some embodiments. The passive devices 344 are disposed over the surface S7 of the redistribution structure 220, in accordance with some embodiments.

The passive devices 345 are disposed over the surface 262b of the core layer 262, in accordance with some embodiments. The passive devices 346 are disposed over the surface 262a of the core layer 262, in accordance with some embodiments. The core layer 262 has an opening 262c, in accordance with some embodiments. The passive devices 347 are in the opening 262c, in accordance with some embodiments. The passive devices 341, 342, 343, 344, 345, 346, and 347 include capacitors, inductors, resistors or another suitable device, in accordance with some embodiments. In some embodiments, a filling layer 350 is filled into the opening 262c. The filling layer 350 is made of an insulating material, in accordance with some embodiments.

In accordance with some embodiments, a chip package structure and the method for forming the same are provided. The method bonds a chip package to a redistribution structure. Since the redistribution structure is formed over a carrier substrate using layer by layer deposition, the planarity of the redistribution structure is improved. Therefore, the yield of the bonding process between the chip package and the redistribution structure is improved.

In accordance with some embodiments, a chip package structure is provided. The chip package structure includes a first redistribution structure having a first surface and a second surface. The first redistribution structure includes a first pad and a second pad, the first pad is adjacent to the first surface, and the second pad is adjacent to and exposed from the second surface. The chip package structure includes a chip package bonded to the first pad through a first bump, wherein a first width of the first pad decreases in a first direction away from the chip package, and a second width of the second pad decreases in the first direction. The chip package structure includes a second bump over the second pad.

In accordance with some embodiments, a chip package structure is provided. The chip package structure includes a first redistribution structure having a first surface and a second surface. The first redistribution structure includes a first pad and a second pad, the first pad is adjacent to the first surface, and the second pad is adjacent to the second surface. The chip package structure includes a chip structure bonded to the first pad through a first bump. The chip package structure includes a second bump bonded to the second pad, wherein the sidewall of the second pad is exposed from the second surface, and the second bump is in contact with the sidewall of the second pad. The chip package structure includes a second redistribution structure having a third surface and a fourth surface. The second redistribution structure includes a third pad and a fourth pad, the third pad is adjacent to the third surface and in contact with the second bump, and the fourth pad is adjacent to the fourth surface. The chip package structure includes a third bump bonded to the fourth pad, wherein the sidewall of the fourth pad is exposed from the fourth surface, and the third bump is in contact with the sidewall of the fourth pad.

In accordance with some embodiments, a chip package structure is provided. The chip package structure includes a redistribution structure having a first surface and a second surface. The redistribution structure includes a first pad and a second pad, the first pad is adjacent to the first surface, and the second pad is adjacent to the second surface. The chip package structure includes a chip package bonded to the first pad through a first bump. The chip package structure includes a molding layer over the redistribution structure surrounding the chip package and the first bump. The chip package structure includes a second bump over the second pad, wherein the sidewall of the second pad is exposed from the second surface, and the second bump is in contact with the sidewall of the second pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
    a first redistribution structure having a first surface and a second surface, wherein the first redistribution structure comprises a first pad and a second pad, the first pad is adjacent to the first surface, and the second pad is adjacent to and exposed from the second surface;
    a chip package bonded to the first pad through a first bump, wherein a first width of the first pad decreases in a first direction away from the chip package, and a second width of the second pad decreases in the first direction;
    a second bump over the second pad,
    wherein the chip package comprises:
        a second redistribution structure having a third surface and a fourth surface, wherein the second redistribution structure comprises a third pad and a fourth pad, the third pad is adjacent to the third surface, and the fourth pad is exposed from the fourth surface and in contact with the first bump, wherein a portion of the first pad is located over the first surface of the first redistribution structure, and the fourth surface of the second redistribution structure is spaced apart from the first surface and the portion of the first pad; and
        a chip structure bonded to the third pad of the second redistribution structure through a third bump, wherein the second redistribution structure is located between the chip structure and the first redistribution structure, wherein a third width of the third pad decreases in a second direction toward the first redistribution structure, and a fourth width of the fourth pad decreases in the second direction, wherein the second direction is the same as the first direction;
    a ring structure over the first redistribution structure and surrounding the chip package; and
    a molding layer over the first redistribution structure and surrounding the chip package and the ring structure, wherein a portion of the molding layer covers a top surface of the ring structure.

2. The chip package structure as claimed in claim 1, wherein the second pad is wider than the first pad.

3. The chip package structure as claimed in claim 1, wherein the second bump is wider than the first bump.

4. The chip package structure as claimed in claim 1, wherein the fourth pad is wider than the third pad.

5. The chip package structure as claimed in claim 1, wherein the first bump is wider than the third bump.

6. The chip package structure as claimed in claim 1, wherein the molding layer surrounds the first bump and is in contact with the portion of the first pad.

7. The chip package structure as claimed in claim 1, wherein the top surface of the ring structure is lower than a top surface of the chip structure.

8. A chip package structure, comprising:
    a first redistribution structure having a first surface and a second surface, wherein the first redistribution structure comprises a first pad and a second pad, the first pad is adjacent to the first surface, and the second pad is adjacent to the second surface;
    a chip structure bonded to the first pad through a first bump, wherein a first width of the first pad decreases in a first direction away from the chip package, and a second width of the second pad decreases in the first direction;
    a second bump bonded to the second pad;
    a second redistribution structure having a third surface and a fourth surface, wherein the second redistribution structure comprises a third pad and a fourth pad, the third pad is adjacent to the third surface and in contact with the second bump, and the fourth pad is adjacent to the fourth surface, wherein the second bump electrically connect the first redistribution structure to the third pad, wherein a portion of the third pad is located over the third surface, and the second surface of the first redistribution structure is spaced apart from the third surface and the portion of the third pad, wherein a third width of the third pad decreases in a second direction away from the first redistribution structure, and a fourth width of the fourth pad decreases in the second direction, wherein the second direction is the same as the first direction;

a third bump bonded to the fourth pad;

a ring structure over the second redistribution structure and surrounding the first redistribution structure and the chip structure; and a first molding layer over the second redistribution structure and surrounding the first redistribution structure, the chip structure, and the ring structure, wherein a portion of the first molding layer covers a top surface of the ring structure.

9. The chip package structure as claimed in claim 8, further comprising:
a second molding layer over the first redistribution structure and surrounding the chip structure and the first bump.

10. The chip package structure as claimed in claim 9, wherein the first molding layer is in contact with the second molding layer and the portion of the third pad, and the first molding layer is in contact with an outer sidewall of the ring structure.

11. The chip package structure as claimed in claim 10, wherein a first top surface of the chip structure, a second top surface of the first molding layer, and a third top surface of the second molding layer are coplanar.

12. The chip package structure as claimed in claim 8, wherein the third bump is wider than the second bump, and the second bump is wider than the first bump.

13. A chip package structure, comprising:
a first redistribution structure having a first surface and a second surface, wherein the first redistribution structure comprises a first pad and a second pad, the first pad is adjacent to the first surface, and the second pad is adjacent to the second surface;
a chip package bonded to the first pad through a first bump, wherein a first width of the first pad decreases in a first direction away from the chip package, and a second width of the second pad decreases in the first direction;
a molding layer over the first redistribution structure and surrounding the chip package and the first bump;
a second bump over the second pad,
wherein the chip package comprises:
a second redistribution structure having a third surface and a fourth surface facing the first redistribution structure, wherein the second redistribution structure comprises a third pad and a fourth pad, the third pad is adjacent to the third surface, and the fourth pad is adjacent to the fourth surface and in contact with the first bump, wherein a portion of the first pad is located over the first surface of the first redistribution structure, and the fourth surface of the second redistribution structure is spaced apart from the first surface and the portion of the first pad; and
a chip structure bonded to the third pad of the second redistribution structure through a third bump, wherein a third width of the third pad decreases in a second direction toward the first redistribution structure, and a fourth width of the fourth pad decreases in the second direction, wherein the second direction is the same as the first direction; and
a ring structure over the first redistribution structure and surrounding the chip package, wherein the molding layer also surrounds the ring structure, and a portion of the molding layer covers a top surface of the ring structure.

14. The chip package structure as claimed in claim 13, wherein the chip package further comprises:
a second molding layer over the second redistribution structure and surrounding the chip structure and the third bump.

15. The chip package structure as claimed in claim 13, further comprising:
a passive device bonded to the second redistribution structure.

16. The chip package structure as claimed in claim 13, further comprising:
a passive device bonded to the first surface of the first redistribution structure, wherein the passive device is located between a sidewall of the chip package and the ring structure.

17. The chip package structure as claimed in claim 14, wherein sidewalls of the second redistribution structure and sidewalls of the second molding layer are contiguous, and sidewalls of the first redistribution structure and sidewalls of the molding layer are contiguous, and
wherein an outer sidewall of the ring structure is offset from the sidewalls of the molding layer.

18. The chip package structure as claimed in claim 15, wherein the passive device is bonded to the fourth surface between the first redistribution structure and the second redistribution structure.

19. The chip package structure as claimed in claim 13, further comprising:
a substrate, wherein the first redistribution structure is disposed between the substrate and the second redistribution structure, and the second bump electrically connect the first redistribution structure to the substrate.

20. The chip package structure as claimed in claim 19, further comprising:
a second ring structure over the substrate and surrounding the first redistribution structure, the second redistribution structure, the chip structure, and the molding layer, wherein the second ring structure is separated from the first redistribution structure, and a thickness of the second ring structure is greater than a sum of a thickness of the first redistribution structure and a thickness of the second redistribution structure; and
a second molding layer over the substrate and surrounding the first redistribution structure, the molding layer, and the second ring structure, wherein a portion of the second molding layer separates the second ring structure from the first redistribution structure and the molding layer.

* * * * *